(12) United States Patent
Sylvestre et al.

(10) Patent No.: US 12,344,523 B2
(45) Date of Patent: Jul. 1, 2025

(54) NEUROMORPHIC MICRO-ELECTRO-MECHANICAL-SYSTEM DEVICE

(71) Applicant: SOCPRA SCIENCES ET GENIE S.E.C., Sherbrooke (CA)

(72) Inventors: Julien Sylvestre, Sherbrooke (CA); Bruno Barazani, Montreal (CA); Guillaume Dion, Sherbrooke (CA)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 754 days.

(21) Appl. No.: 17/414,981

(22) PCT Filed: Dec. 17, 2019

(86) PCT No.: PCT/CA2019/051832
§ 371 (c)(1),
(2) Date: Jun. 17, 2021

(87) PCT Pub. No.: WO2020/124219
PCT Pub. Date: Jun. 25, 2020

(65) Prior Publication Data
US 2022/0063989 A1    Mar. 3, 2022

Related U.S. Application Data

(60) Provisional application No. 62/780,589, filed on Dec. 17, 2018.

(51) Int. Cl.
*B81B 7/00* (2006.01)
*G05D 7/06* (2006.01)

(52) U.S. Cl.
CPC ............... *B81B 7/008* (2013.01); *G05D 7/06* (2013.01); *B81B 2201/07* (2013.01);
(Continued)

(58) Field of Classification Search
CPC ............... B81B 7/008; B81B 2201/07; B81B 2203/0118; B81B 2203/04;
(Continued)

(56) References Cited

U.S. PATENT DOCUMENTS 5,350,189 A   9/1994  Tsuchitani et al.
6,763,340 B1  7/2004  Burns et al.
(Continued)

FOREIGN PATENT DOCUMENTS

CA    2364246 A1   9/2000
CA    2694936 A1   2/2009
(Continued)

OTHER PUBLICATIONS

N. Yazdi, F. Ayazi and K. Najafi, "Micromachined inertial sensors," in Proceedings of the IEEE, vol. 86, No. 8, pp. 1640-1659, Aug. 1998. doi: 10.1109/5.704269.

(Continued)

*Primary Examiner* — Mohammed Shamsuzzaman
(74) *Attorney, Agent, or Firm* — NORTON ROSE FULBRIGHT CANADA LLP

(57) ABSTRACT

A micro-electro-mechanical-system (MEMS) device comprises an inertial component configured for being connected to a structure by a flexible connection allowing the inertial component to deform or move relative to the structure in response to an external stimulus applied to the structure. One or more resonant components are connected to the structure or inertial component, the resonant component(s) having resonant mode(s). Transduction unit(s) measures an oscillatory motion of the resonant component relative to the inertial component and/or structure. An electronic control unit applies a pump of electrostatic force to induce an oscillatory motion of the resonant component(s) in the resonant mode, the oscillatory motion being a non-linear function of a (Continued)

strength of the electrostatic force. The resonant component is configured to be coupled to the inertial component and/or the structure such that a deformation and/or motion of the inertial component in response to an external stimulus changes the strength of the pump, the electronic control unit configured for producing and outputting an output signal being a mathematical function of the measured oscillatory motion. A system for producing a neuromorphic output for a MEMS device exposed to external stimuli is also provided.

20 Claims, 4 Drawing Sheets

(52) U.S. Cl.
CPC ... *B81B 2203/0118* (2013.01); *B81B 2203/04* (2013.01); *B81B 2207/03* (2013.01)

(58) Field of Classification Search
CPC ...... B81B 2207/03; G05D 7/06; G06N 3/044; G06N 3/065; G06N 3/088; G01P 15/123; G01P 15/125; G01P 2015/0814; G01P 15/097; H03B 5/32; H04R 19/005; H04R 19/04; H04R 7/06; H03H 2009/0233; H03H 2009/02464; H03H 2009/02511; H03H 9/2426; H03H 9/2463; H03H 2009/2442; H03H 9/02377; H03H 2009/02291; H03H 2009/02299; H03H 2009/02385; H03H 2009/02496; H03H 9/02275
See application file for complete search history.

(56) References Cited

U.S. PATENT DOCUMENTS

| | | | |
|---|---|---|---|
| 6,938,484 B2 * | 9/2005 | Najafi | G01P 15/125 73/514.32 |
| 7,392,230 B2 | 6/2008 | Nugent | |
| 7,581,324 B1 | 9/2009 | Rogers | |
| 8,315,793 B2 | 11/2012 | Withanawasam | |
| 9,092,729 B2 | 7/2015 | Esterline | |
| 9,165,246 B2 | 10/2015 | Pickett | |
| 9,300,227 B2 | 3/2016 | Quevy et al. | |
| 9,452,922 B2 | 9/2016 | Allegato et al. | |
| 9,477,136 B2 | 10/2016 | Bienstman et al. | |
| 9,630,318 B2 | 4/2017 | Ibarz Gabardos et al. | |
| 9,672,821 B2 | 6/2017 | Krishnaswamy et al. | |
| 9,717,387 B1 | 8/2017 | Szatmary et al. | |
| 9,749,007 B1 | 8/2017 | Martin et al. | |
| 9,852,372 B1 | 12/2017 | Nakano et al. | |
| 9,907,473 B2 | 3/2018 | Tran | |
| 9,940,574 B1 * | 4/2018 | Thibeault | G06N 3/049 |
| 9,969,612 B2 | 5/2018 | Carroll et al. | |
| 9,987,743 B2 | 6/2018 | Izhikevich et al. | |
| 10,013,048 B2 | 7/2018 | Lipasti et al. | |
| 10,031,287 B1 | 7/2018 | Heroux et al. | |
| 10,052,026 B1 | 8/2018 | Tran | |
| 10,052,519 B2 | 8/2018 | Tran et al. | |
| 10,095,976 B1 | 10/2018 | Hoffmann | |
| 11,087,208 B2 * | 8/2021 | Yakopcic | G11C 13/0021 |
| 2010/0312468 A1 * | 12/2010 | Withanawasam | B81B 7/02 438/51 |
| 2012/0326700 A1 | 12/2012 | Swanson et al. | |
| 2015/0024964 A1 | 1/2015 | Kauffman et al. | |
| 2015/0306761 A1 | 10/2015 | O'Connor et al. | |
| 2017/0083081 A1 | 3/2017 | Lipasti et al. | |
| 2017/0116515 A1 | 4/2017 | Abel et al. | |
| 2017/0297908 A1 | 10/2017 | Almeida Loya et al. | |
| 2018/0031601 A1 | 2/2018 | Anac et al. | |
| 2018/0217328 A1 | 8/2018 | Heroux et al. | |
| 2018/0285728 A1 | 10/2018 | Nakano et al. | |
| 2018/0309266 A1 | 10/2018 | Nakano et al. | |
| 2019/0188519 A1 * | 6/2019 | Zink | G06T 7/215 |
| 2019/0303568 A1 * | 10/2019 | Patrick | G06N 3/049 |
| 2020/0041964 A1 * | 2/2020 | Alsaleem | G05B 13/04 |
| 2020/0043477 A1 * | 2/2020 | Busch | G10L 17/00 |
| 2020/0393247 A1 * | 12/2020 | Blankenship | G01P 15/09 |
| 2023/0420276 A1 * | 12/2023 | Hsing | H01L 21/6719 |

FOREIGN PATENT DOCUMENTS

| | | | | |
|---|---|---|---|---|
| CA | 2844685 | A1 | 9/2014 | |
| CA | 2997959 | A1 | 4/2017 | |
| CA | 2947200 | A1 | 5/2017 | |
| CA | 3004344 | A1 | 5/2017 | |
| CN | 1344670 | A | 4/2002 | |
| CN | 103581080 | A | 2/2014 | |
| DE | 112016000699 | T5 * | 10/2017 | G06N 3/049 |
| WO | WO-2004106844 | A2 * | 12/2004 | G01N 13/02 |
| WO | 2012178086 | A1 | 12/2012 | |
| WO | 2013188131 | A | 12/2013 | |
| WO | 2014203038 | A1 | 12/2014 | |
| WO | 2014203039 | A1 | 12/2014 | |
| WO | 2016054340 | A1 | 4/2016 | |
| WO | 2017102972 | A1 | 6/2017 | |
| WO | WO-2019148212 | A1 * | 8/2019 | G06F 21/602 |

OTHER PUBLICATIONS

L. Appeltant et al., "Information processing using a single dynamical node as complex system," Nature Communications, vol. 2, p. 468, Sep. 2011.

J. Torrejon et al., "Neuromorphic computing with nanoscale spintronic oscillators," Nature, vol. 547, No. 7664.

Y. Paquot et al., "Optoelectronic Reservoir Computing," Scientific Reports, vol. 2, No. 1, Dec. 2012.

D. Brunner, M. C. Soriano, C. R. Mirasso, and I. Fischer, "Parallel photonic information processing at gigabyte per second data rates using transient states," Nature Communications, vol. 4, p. 1364, Jan. 2013.

K. Vandoorne et al., "Experimental demonstration of reservoir computing on a silicon photonics chip," Nature Communications, vol. 5, Mar. 2014.

F. Duport, A. Smerieri, A. Akrout, M. Haelterman, and S. Massar, "Fully analogue photonic reservoir computer," Scientific Reports, vol. 6, No. 1, Apr. 2016.

K. Caluwaerts, M. D'Haene, D. Verstraeten, and B. Schrauwen, "Locomotion Without a Brain: Physical Reservoir Computing in Tensegrity Structures," Artificial Life, vol. 19, No. 1, pp. 35-66, Jan. 2013.

J. C. Coulombe, M. C. A. York, and J. Sylvestre, "Computing with networks of nonlinear mechanical oscillators," PLOS ONE, vol. 12, No. 6, p. e0178663, Jun. 2017.

G. Dion et al., "Reservoir computing with a single delay-coupled non-linear mechanical oscillator," Journal of Applied Physics 124, 152132 (2018).

B. Barazani et al., "Micromachined Neuro-Processing Accelerometer" Interdisciplinary Institute for Technological Innovation—3IT, University of Sherbrooke, Proceedings of the 27th CANCAM.

B. Barazani et al., "Microfabricated Neuroaccelerometer: Integrating Sensing and Reservoir Computing in MEMS", Submitted to The Journal of Microelectromechanical Systems, pp. 1-10.

Dexter Johnson, AI on a MEMS Device Brings Neuromorphic Computing to the Edge, EEE Spectrum. https://spectrum.ieee.org/tech-talk/robotics/artificial-intelligence/artificial-intelligence-on-a-mems-device-brings-neuromorphic-computing-to-the-edge.

* cited by examiner

NEUROMORPHIC MICRO-ELECTRO-MECHANICAL-SYSTEM DEVICE

TECHNICAL FIELD

The application relates to devices used in neuromorphic computing and smart sensor devices.

BACKGROUND

The presence of smart sensor devices is increasingly important in the context of the Internet of Things (IoT), and for various applications, such as the control of robots and other non-linear systems. A sensor device that has the capacity of producing a control signal by a local nonlinear transformation of a stimulus is thus desirable.

Neuromorphic computing may be beneficial to such smart sensor devices. As neuromorphic computing entails the training of sensor devices, the capacity of producing control signals from local nonlinear transformations may render such smart sensor devices attractive, especially if they are compact and energy efficient.

SUMMARY

In one aspect, there is provided a micro-electro-mechanical-system (MEMS) device comprising: an inertial component configured for being connected to a structure by a flexible connection allowing the inertial component to deform or move relative to the structure in response to an external stimulus applied to the structure; at least one resonant component adapted to be connected to said structure or inertial component, the resonant component having at least one resonant mode; at least one transduction unit for measuring an oscillatory motion of the at least one resonant component relative to the inertial component and/or structure; and an electronic control unit configured for applying a pump of electrostatic force to induce an oscillatory motion of the at least one resonant component in said resonant mode, the oscillatory motion being a non-linear function of a strength of the electrostatic force, wherein the at least one resonant component is configured to be coupled to the inertial component and/or the structure such that a deformation and/or motion of the inertial component in response to an external stimulus changes the strength of the pump, the electronic control unit configured for producing and outputting an output signal being a mathematical function of the measured oscillatory motion.

Further in accordance with the aspect, for instance, the at least one resonant component is a beam clamped at or near opposite ends thereof.

Still further in accordance with the aspect, for instance, the inertial component is an inertial proof mass supported by springs, and separated by a gap from the beam.

Still further in accordance with the aspect, for instance, the inertial proof mass moves in a single translational degree of freedom toward and away from the beam.

Still further in accordance with the aspect, for instance, the pump is an alternating electric field between the at least one resonant component and the inertial component, the field being created by applying an AC voltage difference between the at least one resonant component and the inertial component.

Still further in accordance with the aspect, for instance, the measured oscillatory motion includes an amplitude of oscillation of the beam measured at N equally-spaced instants in time.

Still further in accordance with the aspect, for instance, the at least one resonant component is a beam connected at its opposite ends to the inertial component.

Still further in accordance with the aspect, for instance, the inertial component is a plate having its periphery in the flexible connection with the structure.

Still further in accordance with the aspect, for instance, the structure has an electrode separated from the at least one resonant component by a gap and coupled to the at least one resonant component.

Still further in accordance with the aspect, for instance, the pump is an alternating electric field between the at least one resonant component and the electrode, the field being created by applying an AC voltage difference between the at least one resonant component and the inertial component.

Still further in accordance with the aspect, for instance, said mathematical function has parameters, and said parameters are calculated by minimizing a mean error between output signals and target signals during a training phase, where a plurality of external stimuli are applied sequentially, each stimulus corresponding to a target signal.

Still further in accordance with the aspect, for instance, said mathematical function is the linear combination of N measured characteristics of said oscillatory motion, computed with a set of weights.

Still further in accordance with the aspect, for instance, said strength of the pump is a mathematical function of said output signal, at the current time or from an instant in the past.

Still further in accordance with the aspect, for instance, the transduction unit includes piezo-resistive strain gauges connected to the at least one resonant component.

Still further in accordance with the aspect, for instance, the pump is a force between the at least one resonant component and the inertial component, wherein said force varies sinusoidally over time with an amplitude and a frequency.

Still further in accordance with the aspect, for instance, said amplitude of the sinusoidal force varies over time according to a repetitive mask pattern.

Still further in accordance with the aspect, for instance, said frequency is close to a natural frequency of the resonant mode of the at least one resonant component.

In another aspect, there is provided a system for producing a neuromorphic output for a MEMS device exposed to external stimuli, comprising: a processing unit; and a non-transitory computer-readable memory communicatively coupled to the processing unit and comprising computer-readable program instructions executable by the processing unit for: applying a pump of electrostatic force to induce an oscillatory motion of at least one resonant component of the MEMS device in a resonant mode of the at least one resonant component, the oscillatory motion being a non-linear function of a strength of the pump of electrostatic force, coupling the at least one resonant component to an inertial component and/or a structure in the MEMS device such that a deformation and/or motion of the inertial component in response to an external stimulus changes the strength of the pump, measuring the oscillatory motion of the at least one resonant component, producing and outputting an output signal being a mathematical function of the measured oscillatory motion.

Further in accordance with the other aspect, for instance, applying a pump of electrostatic force includes applying an AC voltage difference between the at least one resonant component and the inertial component.

Still further in accordance with the other aspect, for instance, applying a pump of electrostatic force includes applying an AC voltage difference between the at least one resonant component and the structure.

Still further in accordance with the other aspect, for instance, the at least one resonant component is a beam and wherein measuring the oscillatory motion includes measuring an amplitude of oscillation of the beam at N equally-spaced instants in time.

Still further in accordance with the other aspect, for instance, producing and outputting an output signal being a mathematical function of the measured oscillatory motion includes calculating parameters of the mathematical function by minimizing a mean error between output signals and target signals during a training phase, where a plurality of external stimuli are applied sequentially, each stimulus corresponding to a target signal.

Still further in accordance with the other aspect, for instance, the mathematical function of the measured oscillatory motion includes the linear combination of N measured characteristics of said oscillatory motion, computed with a set of weights.

Still further in accordance with the other aspect, for instance, said strength of the pump is a mathematical function of said output signal, at the current time or from an instant in the past.

Still further in accordance with the other aspect, for instance, applying a pump of electrostatic force includes applying a force varying sinusoidally over time with an amplitude and a frequency, said amplitude of the sinusoidal force varies over time according to a repetitive mask pattern.

Still further in accordance with the other aspect, for instance, said frequency is close to a natural frequency of the resonant mode of the at least one resonant component.

DESCRIPTION OF THE DRAWINGS

Reference is now made to the accompanying figures in which.

DETAILED DESCRIPTION

Figure 1:
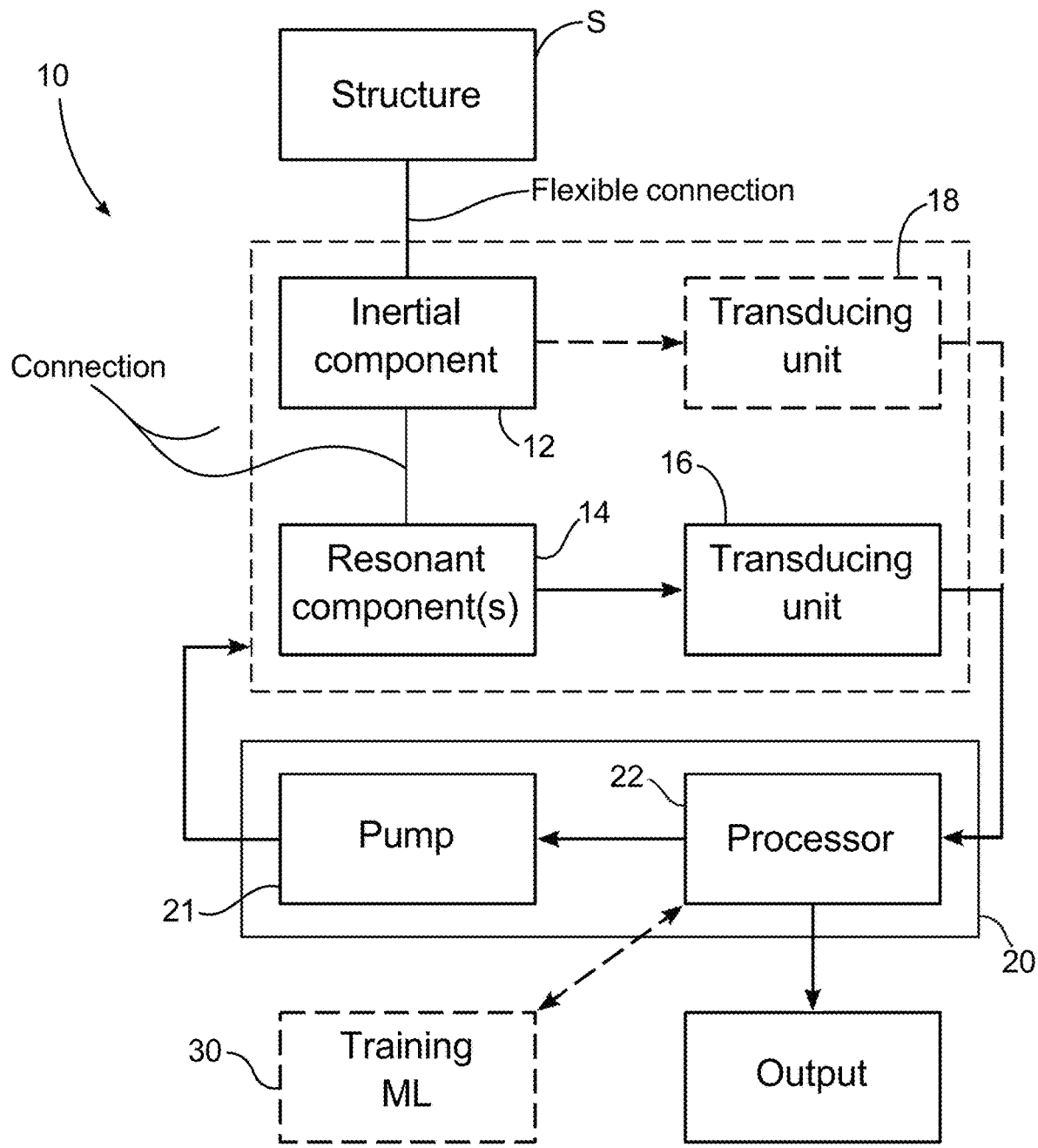
FIG. 1 is a block diagram showing a micro-electro-mechanical system (MEMS) device in accordance with the present disclosure.

Referring to the drawings and more particularly to FIG. 1, a micro-electro-mechanical system (MEMS) device is generally illustrated at 10. For its characteristics, the MEMS device 10 may be referred to as a neuromorphic MEMS device 10.

The MEMS device 10 is of the type used with a structure S that is exposed to external stimuli. The expression "structure" is used as the structure S supports the MEMS device 10. However, as described below, the structure S may be movable or may have movable components, or may be deformable or may have deformable components, though the structure S may be fixed as well. Embodiments described below give examples of such structure S. The MEMS device 10 may be an integral and/or native part of the structure S, or may be added on or retrofitted to the structure S.

The MEMS device 10 has an inertial component 12, and one or more resonant components 14. The inertial component 12 is connected to the structure S by a flexible connection. Therefore, because of the flexible connection, the inertial component 12 may deform and/or move relative to the structure S in response to an external stimulus applied to the structure S. The resonant component(s) 14 may be connected to the structure S and/or the inertial component 12. The resonant component(s) 14 has one or more resonant modes, that will be driven during the use of the MEMS device 10.

In the MEMS device 10, the resonant component(s) 14 defines the physical node(s) of a reservoir computer, with the resonant component(s) 14 being exposed to the external physical stimuli (e.g., acceleration, pressure) through the structure S and/or inertial component 12. The resonant component(s) 14 is selected to have a relatively high resonant frequency ($>10^5$ Hz) in order for the reservoir computer to have adequate performance. In examples below, the resonant component(s) 14 may consequently be of relatively high stiffness and/or be of relatively low mass (e.g., $\sim 10^{-10}$ g) and area (e.g., $\sim 10^{-9}$ m$^2$), which makes them relatively insensitive to external stimuli such as acceleration or pressure. For example, the sensitivity of a suspended mass to external accelerations, defined as the displacement engendered by an acceleration a, is given by Sensitivity=m a/k, where m is the mass of the resonant component and k is the stiffness of its suspension. Similarly, the sensitivity to pressure P of a suspended structure is given by Sensitivity=A P/k, where A is the area of the resonant component perpendicular to the applied pressure. As a result, with relatively low mass, relatively high stiffness, and relatively small area, the effect of external stimuli on the resonant components 14, silicon beams in embodiments below, is negligible in comparison to the effect thereof on the inertial component 12. The resonant component(s) 14 may be interfaced to the structure S and/or inertial component 14, which are more sensitive to external stimuli. The displacements of these relatively larger structures is coupled to the displacement of the small resonant components 14 through an electrostatic force between them, the electrostatic force being dependent on the distance separating them. For the resonant component dimensions provided above, the resonant component(s) may be between 10 000 to 100 000 times less sensitive than the larger inertial components (i.e., the inertial component 14 and/or the structure S) to external stimuli (e.g., acceleration, sound pressure). Hence, the expressions "inertial" and "resonant" are used to illustrate the contrast between the components 12 and 14.

One or more transduction unit 16 may be provided to measure the oscillatory motion of the resonant component(s) 14 relative to the structure S. The transduction unit 16 may take various forms as exemplified below (e.g., piezo-resistive, capacitive, optical). Likewise, one or more transduction unit 18 may be provided to measure the movement or deformation of the inertial component 12, for example relative to the structure S. The transduction unit 18 may take various forms as exemplified below, and may be optional in a neuromorphic mode of the MEMS device 10. It may for instance be used for calibration of the MEMS device 10, by externally applying known physical stimuli on the structure S and relating them to the movement or deformation of the inertial component 12 through the signal produced by the transduction unit 18. As an example, the position of the inertial component 12 relative to the structure S may be obtained by measuring the capacitance of an interdigitated comb structure, with one half mounted on the inertial component 12, and one half fixed to the structure S. The resulting measurement signal could be similar to the signal produced by a conventional MEMS accelerometer, i.e., an accelerometer that does not have neuromorphic computing capabilities. As another example, the position of the inertial component 12 relative to the structure S may be obtained by measuring the capacitance between the inertial component 12 and the structure S. The resulting measurement signal could be similar to the signal produced by a conventional MEMS microphone, i.e., a microphone that does not have neuromorphic computing capabilities.

The mechanical components of the MEMS device 10 may be coupled to an electronic control unit (ECU) 20 to drive the resonant component(s) 14, measure the oscillatory motion and characterize it as a function of the external stimulus. The ECU 20 may have a pump voltage signal that creates a pump 21, the pump signal being wired to physical components of the MEMS device 10, i.e., the inertial component 12 and/or the resonant component(s) 14, and optionally to the structure S. The pump 21 applies an electrostatic force on the MEMS device 10, to induce an oscillatory motion of the resonant component(s) 14 in a predetermined resonant mode thereof, the oscillatory motion being a non-linear function of a strength of the electrostatic force. As described above, the resonant component(s) 14 is mechanically coupled to the inertial component 12 and/or the structure S such that a deformation and/or motion of the inertial component 12 and/or of the structure S in response to an external stimulus changes the strength of the pump 21.

The pump 21, in addition to driving the resonant component(s) 14 near a resonant frequency, also applies an electrostatic force on the inertial component 12 and/or on the structure S. The electrostatic force acting on the inertial component 12 and/or on the structure S is selected to have a magnitude having negligible effect on them (e.g., causing virtually no displacement), as it is at a relatively high frequency (>$10^5$ Hz to match the natural frequency of the resonant component(s) 14), while the inertial component 12 and/or the structure S are only sensitive at much lower frequencies (<$10^4$ Hz). As a result, only the resonant component(s) 14 oscillates in response to the electrostatic force from the pump 21, and the displacement of the inertial component 12, due to an external stimulus, serves to modulate the amplitude of the electrostatic force by varying the distance between the resonant component(s) 14 and the inertial component 12 and/or the structure S in response to external stimuli. Hence, the ECU 21 generates the pump by applying an alternating voltage difference between the resonant component(s) 14, and the inertial component 12 and/or the structure S.

By applying an alternating voltage difference between the resonant component 14 and the inertial component 12 and/or structure S, the oscillatory motion is induced in the resonant component(s) 14 through electrostatic forces resulting from this electrostatic coupling. The amplitude of this oscillatory motion is governed by the amplitude of the pump and by the gap between the inertial component 12 and/or structure S and the resonant component 14. Upon deformation or displacement of the inertial component 12, the gap between the resonant component(s) 14 and the inertial component 12 and/or structure S is modified. As a result, a strength of the electrostatic pump is modulated, and the magnitude of the strength may be used in neuromorphic mode of the MEMS device 10.

The ECU 20 may include a processor 22 for producing measured characteristics of the oscillatory motion as measured by the transduction unit(s) 16, the processor 22 producing an output signal being a mathematical function of said measured characteristics. The processor 22 may operate in conjunction with non-transitory computer-readable memory of the ECU 20, the computer-readable memory communicatively coupled to the processor 22 and comprising computer-readable program instructions executable by the processor 20. In an embodiment, the processor 22 is an integrated circuit component that may produce the output signal for use by another computer system, or for communication to a user. In a simple form, the processor 22 is an electrical circuit producing the pump 21 in the form of an AC voltage difference between the resonant component 14 and the inertial component 12, and a position-dependent voltage from the transduction unit(s) 16.

The computing by the processor 22 includes measuring a plurality of characteristics of the oscillatory motion as a function of time to construct an output signal. The amplitude of the output signal is a mathematical function of the measured characteristics. This mathematical function may be computed so as to minimize the mean error between the output signals and target signals during a training phase, where a plurality of external stimuli are applied sequentially, each stimulus corresponding to a target signal.

The measured characteristics of the oscillatory motion may include the deflection of the resonant component(s) 14 measured at N equally-spaced instants in time, using the transducer unit(s) 16. For example, the measured characteristics may be the position of the resonant component(s) at instants of time. As another example, the measured characteristics may be the voltage drop across a piezoresistive strain gauge configured to measure the displacement of the resonant component(s) 14. The mathematical function for creating the output signal is the linear combination of the measured characteristics, computed with a set of weights. The weights are computed with:

$$w = y'X^T(XX^T + \lambda I)^{-1}$$

where y' is the target vector, X are the measured characteristics in matrix form, $\lambda$ is a small regularization parameter and I is the identity matrix. When a stimulus is applied to the MEMS device 10, a set of measured characteristics can be recorded by the ECU 20. The computed weights can be used to produce an output y for a set of measured characteristics placed in a vector x, according to $$y = w^T x.$$

The mechanical non-linearity of the MEMS device 10 may be used to implement a computing device that works in the mechanical domain, in a manner similar to neuro-computing. The output of the MEMS device 10 is produced by linearly combining the measured characteristics from the transduction unit(s) 16 of selected nodes in a network, which can be real or virtual. In the case of a virtual network, a single MEMS device 10 is used and the network may be created by amplitude-modulating the pump signal with a binary mask. In the case of a real network, numerous MEMS device 10 may be used and the resonant components could, for example, be micro beams of silicon connected via small flexure springs so the beams can each oscillate and exchange energy via the flexure springs.

In the case of a virtual network, the amplitude of the pump 21 may be modulated by a binary mask. The binary mask may have a certain duration, and may change value at fixed times. As an example, the binary mask may have a duration D and may contain M values separated by a time t, such that D=M t. As an additional example, the values of the mask may be chosen between two levels, such that at every time step, the pump 21 may have an amplitude which is given by one of the two levels. In the case of a virtual network, the ECU 20 may store in its memory values of the measured characteristics that are sampled at every time period r. The ECU 20 may store up to N consecutive values in a vector x, discarding values that were stored a time larger than N r in the past. At every time period r, the ECU 20 may then form the linear combination $$y = w^T x,$$

where w is a weight vector. The ECU 20 may store the values y consecutively in memory. The ECU 20 may then set the amplitude of the pump voltage to be the product of the binary mask at the current time, and of the value of the linear combination y that was stored M time steps in the past. As an example, the values M and N may be equal.

In an embodiment, the ECU 20 may be used in conjunction with a machine-learning (ML) module 30 or like training system, for the output signal to be in a desired form. The ML module 30 may be part of the ECU 20 as well. The ML module 30 may obtain feedback of the user as to a nature or form of the desired output, which feedback is an integral part of the training. The ML module 30 may include at least 100 captures of measured characteristics that are synchronized with the application of external stimuli. As a consequence of the training by the ML algorithm, the learning module 30 may produce and output an optimal set of weights to from a linear combination of the measured characteristics. The ML algorithm may be selected from different supervised or unsupervised machine learning algorithms. The ML algorithm may help train the ECU 20 such that the mathematical function may have its parameters calculated by minimizing a mean error between output signals and target signals during a training phase, where a plurality of external stimuli are applied sequentially, each stimulus corresponding to a target signal. The mathematical function may be the linear combination of the characteristics of the measured oscillatory motion, computed with a set of weights.

Figure 2:
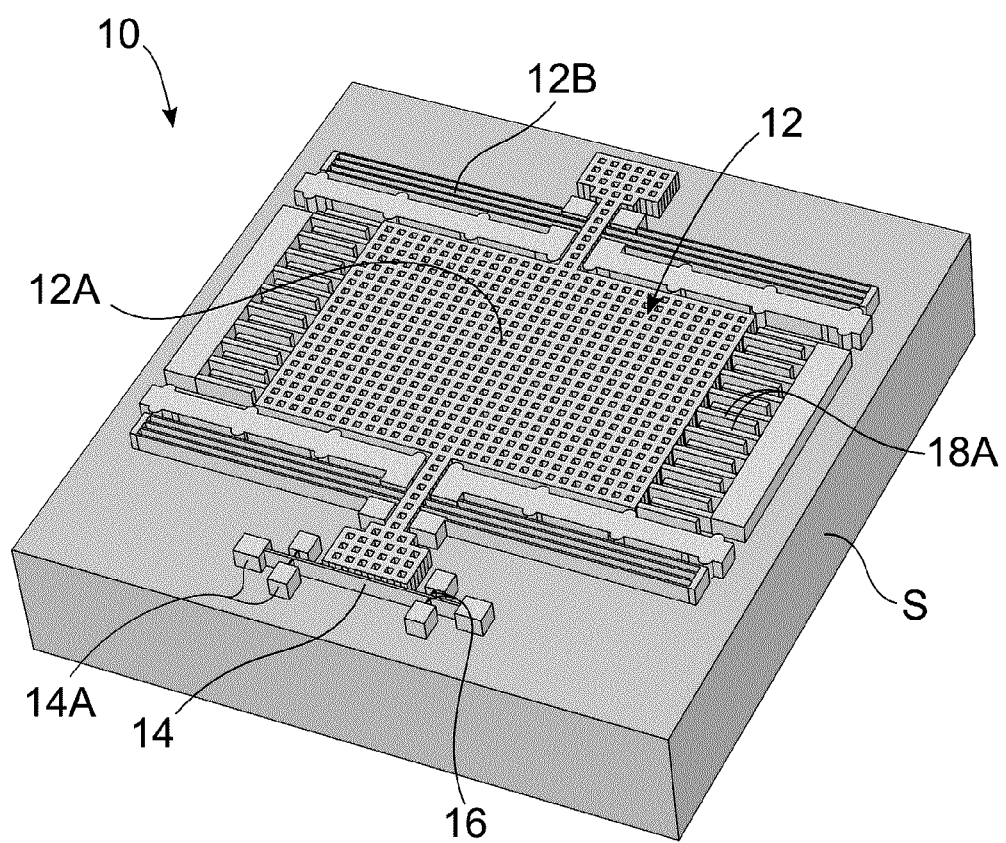
FIG. 2 is a perspective view of MEMS device in accordance with an embodiment of the present disclosure in which a resonant component is electrostatically coupled to an inertial component.

Referring now to FIG. 2, an embodiment of the MEMS device 10 is shown in greater detail. Like reference numerals in FIGS. 1 and 2 will refer to corresponding elements. The MEMS device 10 of FIG. 2 has its resonant component 14 electrostatically coupled to the inertial component 12.

In FIG. 2, the MEMS device 10 has, as resonant component 14, a silicon beam, although other materials may be used. The resonant component 14 is supported by a substrate that is the structure S supporting the MEMS device 10. For example, anchors 14A support the resonant component 14. The resonant component 14 is also suspended over the substrate S by the anchors 14A. The anchors 14A are designed to allow vibrations of the resonant component 14, for instance by clamping the beam at or near its opposite ends. As shown in FIG. 2, the resonant component 14 may consist of a single beam. The resonant components 14 may also include multiple beams, such as beams attached to one another in order to define a mechanical network.

The transduction units 16 or like sensors may be in the form of gauges used to measure oscillations of the resonant component 14. As an example, the gauges may be piezoresistive gauges transversally attached to the beam. Other types of sensors may also be used to measure the oscillations of the resonant component 14. The MEMS device 10 also has the inertial component 12 in the form of a mass 12A. The mass 12A is connected to the substrate S, by a flexible connection including one or more flexible members 12B, allowing the inertial component 12 to deform or move relative to the substrate S in response to an applied external stimulus. For example, the mass 12A is an inertial proof mass, and the flexible member 12B may be compliant springs and/or flexure springs, among possibilities. The inertial proof mass 12A may be suspended over the substrate S by compliant springs 12B. As observed from FIG. 2, a gap is present between the beam 14 and the inertial proof mass 12A. According to an embodiment, the compliant springs 12B constrain the inertial proof mass 12A to in-plane, uniaxial displacement in response to external stimuli, i.e., one translational degree of freedom, toward and away the beam 14. This motion of the proof mass 12A modulates the force acting on the resonant beam 14. This constitutes a coupling arrangement between the beam 14 and the proof mass 12A. Other embodiments are contemplated, with beams 14 along other sides, and bi-directional movement of the proof mass 12A, as another possibility. As another example, the inertial component 12 may be a single monolithic component including a cantilever beam supporting a mass portion about a frame.

Various types of transduction unit(s) 18 or like sensors may be used to measure the displacement of the inertial component 12. In the illustrated embodiment, the displacement of the inertial component 12 may be assessed by measuring a change in capacitance between interdigitated electrodes 18A. The interdigitated electrodes 18A may include combs attached to the proof mass 12A so as to move concurrently with the proof mass 12A, while combs are connected to the substrate S, and thus remain fixed relative to the combs connected to the proof mass 12A. The transduction unit(s) 18 may be used to validate the measured characteristics of the oscillatory motion measured by the gauges 16, and may hence be optional.

The resonant component(s) 14 of the MEMS device 10 is electrostatically driven at a frequency near its natural frequency, via pump 21 (FIG. 1). The electrostatic drive may be achieved by applying a signal (e.g., alternating (AC) voltage) to the resonant component(s) 14. In parallel, a signal (e.g., AC voltage) is also applied to the inertial proof mass 12A. In the illustrated embodiment, the compliant springs 12A constrain the inertial proof mass 12A to the in-plane, uniaxial movement as a response to and external stimulus, while the beam 14 is designed to move parallel to the plane of the substrate S. The movement of the proof mass 12A modulates the electrostatic force acting on the resonant beam 14, and thus modulates the strength of the pump 21.

In the illustrated embodiment, with the single silicon beam defining the resonant component 14, a virtual network is created by modulating the amplitude of the sinusoidal pump voltage signal from the pump 21 with a repetitive mask pattern. The strength of the pump 21 is also a mathematical function of the oscillation amplitude of the beam 14 from an instant in the past, i.e., delayed feedback.

The measured characteristics of the oscillatory motion include the deflection of the beam 14 measured at N equally-spaced instants in time, using for example the gauges 16. The mathematical function described above may then be used by the ECU 20 to produce the output signal.

In an embodiment of FIG. 2, the pump 21 is an alternating electric field between the resonant component 14 and the inertial component 12, the field being created by the processor 22 applying an AC voltage difference between the resonant component 14 and the inertial component 12. The pump 21 induces an oscillatory motion of the resonant component 14 in the resonant mode. The oscillatory motion induced by the ECU 20 is a non-linear function of the strength of the pump 21. Through the oscillatory motion, the coupling arrangement between the resonant component 14 and the inertial component 12 causes a change in the strength of the pump 21 as a result of deformation and/or motion of the inertial component 12 in response to an external stimulus. The ECU 20 may hence calculate a plurality of measured characteristics of the oscillatory motion, and consequently produce an output signal, whose amplitude is a mathematical function of the measured characteristics of the oscillatory motion. The mathematical function is only a function of the oscillatory motion of the resonant component(s) 14. The oscillatory motion is a function of the pump 21, which itself is a function of the pump voltage and of the stimulus.

The arrangement described above for FIG. 2 may be used as an electromechanical recurrent neural network (RNN) microfabricated (typically in silicon) using MEMS technology. The inertial component 12 acts as an intermediary to interface inertial forces with the resonant component 14, i.e., the MEMS RNN, implemented as a reservoir computer (RC). The inertial component 12 is placed in close proximity to the resonant component(s) 14 and is polarized with a sinusoidal pump voltage signal, such that an electrostatic force, the pump 21, drives the mechanical modes of the RC. Upon displacement of the inertial component 12, the electrostatic driving force is modulated by varying the distance between the resonant component 14, acting as MEMS RC, and the inertial mass 12A. Because of the mechanical non-linearity of output signal, the resonant MEMS device 10 may be used as an artificial neuron exploited in the mechanical domain, in a manner similar to neuro-computing. The output of the RC is produced by linearly combining the piezo-resistive or capacitive displacement signals of selected nodes in the network, which can be real or virtual.

Figure 3:
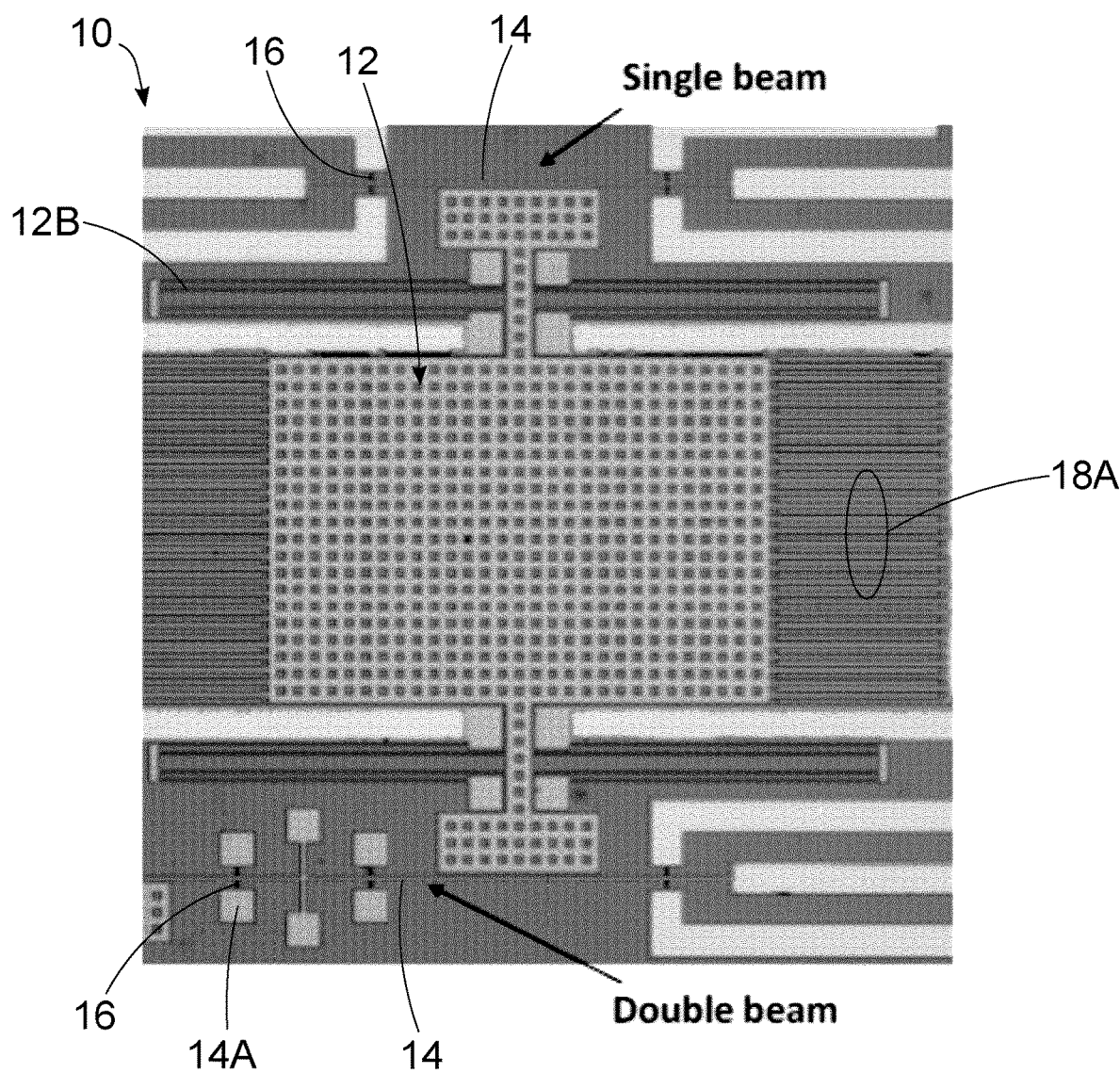
FIG. 3 is a microphotograph of an exemplary prototype of the MEMS device of FIG. 2.

Referring to FIG. 3, a microphotograph of the MEMS device 10 is shown. The MEMS device 10 may be used with a substrate made of a silicon-on-insulator (SOI) wafer with a silicon layer of 50 um and an oxide layer of 4 um. The microfabrication process may include, as an example, 1) Photolithography of the Si layer: —Spin of AZ1512 photoresin, —Exposition, 60 mJ/cm$^2$, —Development; 2) Advanced silicon etching; 3) Photolithography of the metal layer: —Spin of NR4 8000P, —Exposition, 500 mJ/cm$^2$, —Development; 4) Metallization; 5) Lift-off; 6) HF vapor liberation. This is an exemplary fabrication method.

It is observed that the MEMS device 10 of FIG. 3 has two or more resonant components 14, in the form of two distinct beams. The use of multiple resonant components 14 in any of the embodiments described herein may assist in an accuracy of the neuromorphic computing of the MEMS device 10, by allowing a larger number of measured oscillatory characteristics and/or increasing the relevance of the measured oscillatory characteristics for neuromorphic computing due to the richer dynamics provided by multiple coupled resonant components 14. For example, the use of the multiple resonant components 14 may allow the MEMS device 10 to operate under different resonant frequencies (e.g., one distinct resonant frequency per resonant component 14) and/or with different electrostatic coupling gaps, resulting in such scenarios in different mechanical responses from the multiple resonant components 14, each one of the multiple resonant components responding to a different amplitude variation of the pump 21. Each resonant component 14 may be coupled to its own processor 22 of a same ECU 20, or of different ECU 20. The different amplitude variations may lead to the processors 22 performing differently on different tasks. For example, with two components 14 and two processors 22, one may perform well on task A, and poorly on task B. The situation might be inverted for the other component 14, which may perform well on task B, and poorly on task A. Combining the output of both components 14 may lead to a system that performs well on task A and on task B.

Figure 4:
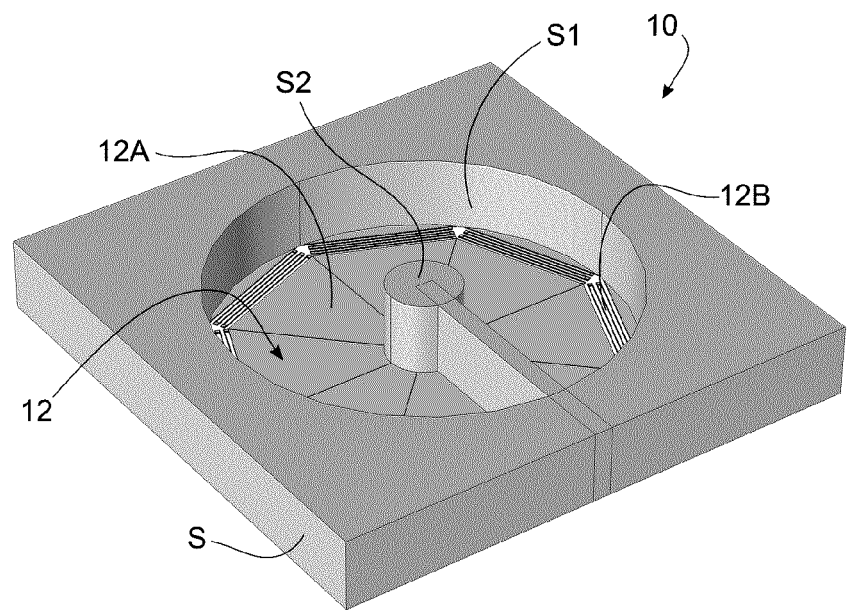
FIG. 4 is a first perspective view of MEMS device in accordance with another embodiment of the present disclosure in which a resonant component is electrostatically coupled to a structure.
Figure 5:
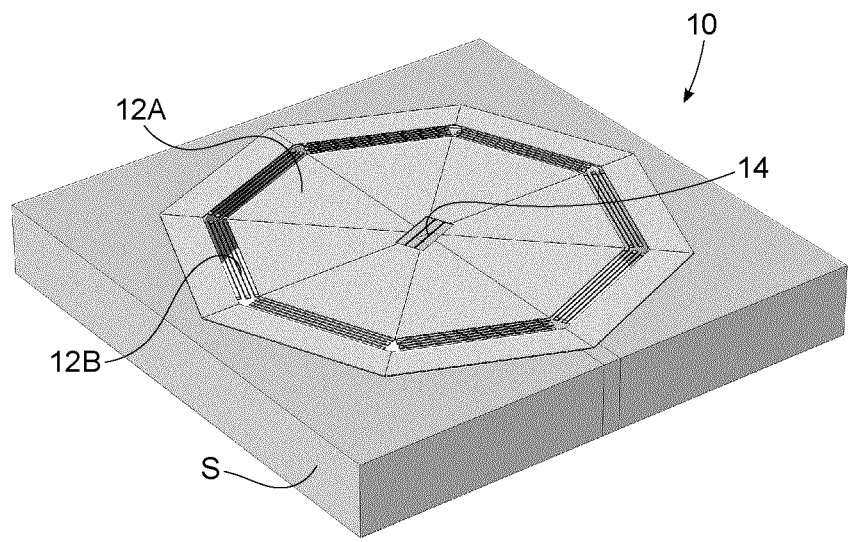
FIG. 5 is a second perspective view of MEMS device of FIG. 4.

Referring to FIGS. 4 and 5, another embodiment of the MEMS device 10 is shown, in which the resonant component(s) 14 is(are) electrostatically coupled to the structure S, as opposed to being electrostatically coupled to the inertial component 12. The MEMS device 10 of FIGS. 4 and 5 may be used for example as a MEMS microphone, similar in its constitution and function to the neuromorphic MEMS inertial device 10.

The MEMS device 10 of FIGS. 4 and 5 comprises an electrically conductive structure S to which the inertial component 12 in the form of a membrane 12A, such as a regular polygonal plate, is connected through flexible members 12B arranged periodically around the plate 12A and anchored at one end. This configuration allows the plate 12A to move or deform in a direction normal to its plane in response to sound pressure exerting a force on the plate 12A. For example, the flexible members 12B may be suspension units composed of folded compliant silicon beams. In an embodiment, the plate 12A deforms and its flexible connection is through its elastic deformation relative to the structure S. A cylindrical hole S1 is defined in the structure S (e.g., etched) in order to relieve back pressure upon displacement of the plate 12A and to prevent the electrostatic pull-in (collapse) of the plate 12A onto the structure S.

One or more resonant components 14 are embedded in the plate 12A. According to an embodiment, the resonant components 14 in FIGS. 4 and 5 may for example be one or more silicon beams patterned in the suspended plate 12 and anchored to this plate at both ends. For the transduction unit(s) 16, a piezoresistor may be patterned over the resonant component(s) 14, to measure its oscillations. As an example, the piezoresistor may be a small area of p-type silicon embedded in a larger intrinsic or n-type region.

In the illustrated embodiment, the flexible connection of the sensing plate 12A constraint same to an out-of-plane, uniaxial movement as a response to the external sound pressure stimulus. The beam(s) 14 is(are) also designed to move in a direction normal to the plane of the sensing plate 12A. The movement of the sensing plate 12A modulates the strength of the electrostatic force acting on the resonant beam(s) 14 by varying the gap between the resonant beam(s) 14 and the drive electrode S2.

The high frequency oscillatory motion of the resonant component(s) 14 is driven by an electrostatic pump 21 (FIG. 1), wherein polarizing the structure with respect to the resonant components 14 via a sinusoidal electrical signal of the pump 21 generates an attractive force between a fixed driving electrode S2 of the structure S and the individual resonant components 14. The strength of the pump 21 is coupled to the external sound pressure stimuli through the induced displacement of the plate 12A. This results in a variation in the gap between the resonant components 14 and the driving electrode S2 of the structure S. As described in FIG. 1, the resonant component(s) 14 is(are) electrostatically driven at a frequency near its(their) natural frequency.

The processor 22 (e.g., a microcontroller) measures a plurality of characteristics of the oscillatory motion of the resonant components 14, the processor 22 producing an output signal, wherein the amplitude of the output signal is a mathematical function of the measured characteristics, such as a linear combination using weights computed to achieve a specific task. In one embodiment, the task is to produce an output signal that varies in voltage between distinct levels (e.g., 10 levels), each level corresponding to a particular word spoken by a person, with the sound pressure being detected by the microphone MEMS device 10. This is an example among others.

The MEMS device 10 of FIGS. 4 and 5 may include a structure S made of a silicon-on-insulator (SOI) wafer with a silicon device layer of 10 um (in which the moving parts are defined) and an oxide layer of 5 um (defining the gap distance). As an example, the microfabrication process may include: 1) Photolithography and advanced silicon etching of the substrate; 2) Photolithography of the Si device layer: —Piezoresistor patterning and ion implantation, —Mechanical structures definition and subsequent advanced silicon etching (ASE); 3) Photolithography of the metal layer: —Patterning of the electrical traces and wirebonding pads: —Metal evaporation and lift-off; and 4) HF vapour release of suspended mechanical structures.

In the embodiments of FIGS. 1 to 5, the electronic control unit 20 may be a system that performs given tasks with the external stimulus on the mechanical components of the MEMS device 10. For example, the electronic control unit 20 may be a system for producing a neuromorphic output for the MEMS device 10 exposed to external stimuli with its processing unit 22 and a non-transitory computer-readable memory communicatively coupled to the processing unit 22 and comprising computer-readable program instructions executable by the processing unit for: applying the pump 21 of electrostatic force to induce an oscillatory motion of the resonant component(s) 14 of the MEMS device 10 in a resonant mode, the oscillatory motion being a non-linear function of a strength of the pump 21; electrostatically coupling the resonant component(s) 14 to the inertial component 12 and/or structure S in the MEMS device 10 such that a deformation and/or motion of the inertial component 12 in response to an external stimulus changes the strength of the pump 21; measuring the oscillatory motion of the resonant component(s) 14; and producing and outputting an output signal being a mathematical function of the measured oscillatory motion and strength of the pump 21.

The invention claimed is:

1. A micro-electro-mechanical-system (MEMS) device comprising:
   an inertial component configured for being connected to a structure by a flexible connection allowing the inertial component to deform or move relative to the structure in response to an external stimulus applied to the structure;
   at least one resonant component adapted to be connected to said structure or inertial component, the resonant component being movable relative to said structure and said inertial component, the resonant component having at least one resonant mode;
   at least one transducing unit for measuring an oscillatory motion of the at least one resonant component relative to the inertial component and/or structure; and
   an electronic control unit configured for applying a pump of electrostatic force to induce an oscillatory motion of the at least one resonant component in said resonant mode, the oscillatory motion being a non-linear function of a strength of the electrostatic force, wherein the at least one resonant component is configured to be coupled to the inertial component and/or the structure such that a deformation and/or motion of the inertial component in response to an external stimulus changes the strength of the electrostatic force, the electronic control unit configured for producing and outputting an output signal being a mathematical function of the measured oscillatory motion.

2. The MEMS device of claim 1, wherein the at least one resonant component is a beam clamped at or near opposite ends thereof.

3. The MEMS device of claim 2, wherein the inertial component is an inertial proof mass supported by springs, and separated by a gap from the beam.

4. The MEMS device according to claim 3, wherein the inertial proof mass moves in a single translational degree of freedom toward and away from the beam.

5. The MEMS device of claim 2, wherein the electrostatic force results from an alternating electric field between the at least one resonant component and the inertial component, the field being created by applying an AC voltage difference between the at least one resonant component and the inertial component.

6. The MEMS device of claim 2, wherein the measured oscillatory motion includes an amplitude of oscillation of the beam measured at N equally-spaced instants in time.

7. The MEMS device of claim 1, wherein the at least one resonant component is a beam connected at its opposite ends to the inertial component.

8. The MEMS device of claim 7, wherein the inertial component is a plate having its periphery in the flexible connection with the structure.

9. The MEMS device according to claim 8, wherein the structure has an electrode separated from the at least one resonant component by a gap and coupled to the at least one resonant component.

10. The MEMS device of claim 7, wherein the electrostatic force results from an alternating electric field between the at least one resonant component and the electrode, the field being created by applying an AC voltage difference between the at least one resonant component and the inertial component.

11. The MEMS device of claim 1, wherein said mathematical function has parameters, and said parameters are calculated by minimizing a mean error between output signals and target signals during a training phase, where a plurality of external stimuli are applied sequentially, each stimulus corresponding to a target signal.

12. The MEMS device of claim 1, wherein said mathematical function is the linear combination of N measured characteristics of said oscillatory motion, computed with a set of weights.

13. The MEMS device of claim 1, wherein said strength of the electrostatic force is a mathematical function of said output signal, at the current time or from an instant in the past.

14. The MEMS device of claim 1, wherein the transducing unit includes piezo-resistive strain gauges connected to the at least one resonant component.

15. The MEMS device of claim 1, wherein the electrostatic force is between the at least one resonant component and the inertial component, wherein said force varies sinusoidally over time with an amplitude and a frequency.

16. The MEMS device of claim 15, wherein said amplitude of the sinusoidal force varies over time according to a repetitive mask pattern.

17. The MEMS device of claim 15, wherein said frequency is close to a natural frequency of the resonant mode of the at least one resonant component.

18. A system for producing a neuromorphic output for a MEMS device exposed to external stimuli, comprising:
   a processing unit; and
   a non-transitory computer-readable memory communicatively coupled to the processing unit and comprising computer-readable program instructions executable by the processing unit for:
   applying a pump of electrostatic force to induce an oscillatory motion of at least one resonant component of the MEMS device in a resonant mode of the at least one resonant component, the oscillatory motion being a non-linear function of a strength of the electrostatic force, coupling the at least one resonant component to an inertial component and/or a structure in the MEMS device such that a deformation and/or motion of the inertial component in response to an external stimulus changes the strength of the electrostatic force, the resonant component being movable relative to said structure and said inertial component,
   measuring the oscillatory motion of the at least one resonant component,
   producing and outputting an output signal being a mathematical function of the measured oscillatory motion.

19. The system of claim 18, wherein applying the pump of electrostatic force includes applying an AC voltage difference between the at least one resonant component and the inertial component.

20. The system of claim 18, wherein applying the pump of electrostatic force includes applying an AC voltage difference between the at least one resonant component and the structure.

* * * * *